United States Patent
Mimura

(10) Patent No.: US 12,271,157 B2
(45) Date of Patent: Apr. 8, 2025

(54) TEMPERATURE CONTROL SYSTEM WITH CIRCULATING FLUID

(71) Applicant: KELK Ltd., Kanagawa (JP)

(72) Inventor: Kazuhiro Mimura, Kanagawa (JP)

(73) Assignee: KELK Ltd., Kanagawa (JP)

( * ) Notice: Subject to any disclaimer, the term of this patent is extended or adjusted under 35 U.S.C. 154(b) by 399 days.

(21) Appl. No.: 17/911,884

(22) PCT Filed: Feb. 12, 2021

(86) PCT No.: PCT/JP2021/005300
§ 371 (c)(1),
(2) Date: Sep. 15, 2022

(87) PCT Pub. No.: WO2021/186976
PCT Pub. Date: Sep. 23, 2021

(65) Prior Publication Data
US 2023/0147288 A1    May 11, 2023

(30) Foreign Application Priority Data

Mar. 18, 2020   (JP) ................................ 2020-048351

(51) Int. Cl.
*G05B 11/42* (2006.01)
*G05D 23/19* (2006.01)
(Continued)

(52) U.S. Cl.
CPC ......... *G05B 11/42* (2013.01); *G05D 23/1902* (2013.01); *G05D 23/1927* (2013.01); *G05D 23/22* (2013.01); *H01L 21/683* (2013.01)

(58) Field of Classification Search
CPC . G05B 11/42; G05D 23/1902; G05D 23/1927
(Continued)

(56) References Cited

U.S. PATENT DOCUMENTS 9,984,908 B2    5/2018   Kobayashi et al.
2007/0235134 A1   10/2007   Iimuro
(Continued)

FOREIGN PATENT DOCUMENTS

CN    103930843 A    7/2014
JP    2005-79415 A    3/2005
(Continued)

*Primary Examiner* — Jigneshkumar C Patel
(74) *Attorney, Agent, or Firm* — Fish & Richardson P.C.

(57) ABSTRACT

A temperature control system includes: first adjusting the temperature of fluid in a first portion the fluid having a first temperature determined based on a second temperature higher than the first temperature or the second temperature; second adjusting the temperature of the fluid supplied to a target at a second portion between the first portion and the target; first detecting the temperature of first fluid supplied from the first to second portion; second detecting the temperature of the fluid or the target at a predetermined position between an outlet of the second portion and an inlet of the first portion; controlling the first adjusting based on the first detected value such that the temperature of the first fluid becomes a first temperature; and controlling the second adjusting based on a the second detected such that the temperature of the fluid becomes a second temperature at the predetermined position.

15 Claims, 8 Drawing Sheets

(51) Int. Cl.
*G05D 23/22* (2006.01)
*H01L 21/683* (2006.01)

(58) Field of Classification Search
USPC .......................................................... 700/42
See application file for complete search history.

(56) References Cited

U.S. PATENT DOCUMENTS

| | | | |
|---|---|---|---|
| 2009/0011376 A1* | 1/2009 | Okada | G03F 7/70858 |
| | | | 355/30 |
| 2010/0116788 A1 | 5/2010 | Singh et al. | |
| 2010/0206519 A1* | 8/2010 | Cho | H01L 21/67248 |
| | | | 165/104.19 |
| 2014/0262199 A1* | 9/2014 | Kobayashi | H01L 21/67248 |
| | | | 165/61 |
| 2016/0238296 A1 | 8/2016 | Saint Pierre et al. | |
| 2017/0357277 A1 | 12/2017 | Ono | |
| 2018/0269090 A1* | 9/2018 | Kobayashi | H01L 21/6831 |
| 2019/0310034 A1 | 10/2019 | Kobayashi et al. | |
| 2020/0132344 A1 | 4/2020 | Seki | |

FOREIGN PATENT DOCUMENTS

| | | |
|---|---|---|
| JP | 2005-178141 A | 7/2005 |
| JP | 2005-332287 A | 12/2005 |
| JP | 2011-108954 A | 6/2011 |
| JP | 2013-105359 A | 5/2013 |
| JP | 2016-057054 A | 4/2016 |
| JP | 2018-178141 A | 11/2018 |
| JP | 2019-194753 A | 11/2019 |
| KR | 10-2014-0089536 A | 7/2014 |
| TW | 392102 B | 6/2000 |
| TW | 200807613 A | 2/2008 |
| TW | 201033398 A | 9/2010 |
| TW | 201116958 A | 5/2011 |
| TW | 201339781 A | 10/2013 |
| TW | 201629412 A | 8/2016 |
| TW | 201920887 A | 6/2019 |
| TW | 201928563 A | 7/2019 |
| TW | 201945878 A | 12/2019 |
| WO | 9612219 A1 | 4/1996 |
| WO | 2013073537 A1 | 5/2013 |
| WO | 2017077975 A1 | 5/2017 |

* cited by examiner

TEMPERATURE CONTROL SYSTEM WITH CIRCULATING FLUID

CROSS-REFERENCE TO RELATED APPLICATIONS

This application is a National Stage application of International Application No. PCT/JP2021/005300, filed on Feb. 12, 2021, which claims priority to Japanese Patent Application No. 2020-048351, filed on Mar. 18, 2020. The contents of the prior applications are incorporated herein in their entirety.

FIELD

The present disclosure relates to a temperature control system.

BACKGROUND

In a technical field related to semiconductor manufacturing apparatuses, temperature control systems that control the temperature of a temperature control target by circulating fluid as the one disclosed in Patent Literature 1 are used. Patent Literature 1 describes a method of obtaining a target temperature by mixing feed fluid from an external high-temperature chiller and a low-temperature chiller with fluid in circulation by using a mixing valve in order to change the target temperature as quickly as possible during the process.

CITATION LIST

Patent Literature

Patent Literature 1: JP 2013-105359 A

SUMMARY

Technical Problem

However, in the method disclosed in Patent Literature 1, although the dynamic characteristics of the mixing valve are high gain and high response, there is a problem that temperature controllability is poor and hunting is likely to occur due to nonlinearity between the valve opening degree of the mixing valve and the flow rate, a dead zone of the valve opening, nonlinear elements such as hysteresis, a low response of a temperature control target, dead time of the temperature control target, and the like.

An object of the present disclosure is to control the temperature of fluid with high accuracy.

Solution to Problem

According to an aspect of the present invention, a temperature control system, comprises: a circulation flow path that includes a temperature control target, the circulation flow path through which fluid flows; a first temperature control device that adjusts a temperature of the fluid in a first portion of the circulation flow path by supplying, to the first portion, at least one of the fluid having a first temperature or the fluid having a second temperature higher than the first temperature; a second temperature control device that adjusts the temperature of the fluid supplied to the temperature control target at a second portion of the circulation flow path between the first portion and the temperature control target; a first temperature sensor that detects the temperature of the fluid supplied from the first portion to the second portion; a second temperature sensor that detects the temperature of the fluid or the temperature control target at a predetermined position in the circulation flow path between an outlet of the second portion and an inlet of the first portion; a first controller that controls the first temperature control device on a basis of a detection value of the first temperature sensor such that the temperature of the fluid supplied from the first portion to the second portion becomes a first target temperature; and a second controller that controls the second temperature control device on a basis of a detection value of the second temperature sensor such that the temperature of the fluid becomes a second target temperature at the predetermined position, wherein the first target temperature is determined on a basis of the second target temperature.

Advantageous Effects of Invention

According to the present disclosure, the temperature of fluid can be controlled with high accuracy.

DESCRIPTION OF EMBODIMENTS

Hereinafter, embodiments of the present disclosure will be described with reference to the drawings; however, the present disclosure is not limited thereto. Components of the embodiments described below can be combined as appropriate. Moreover, some of the components may not be used.

First Embodiment

<Overview of Temperature Control System>

Figure 1:
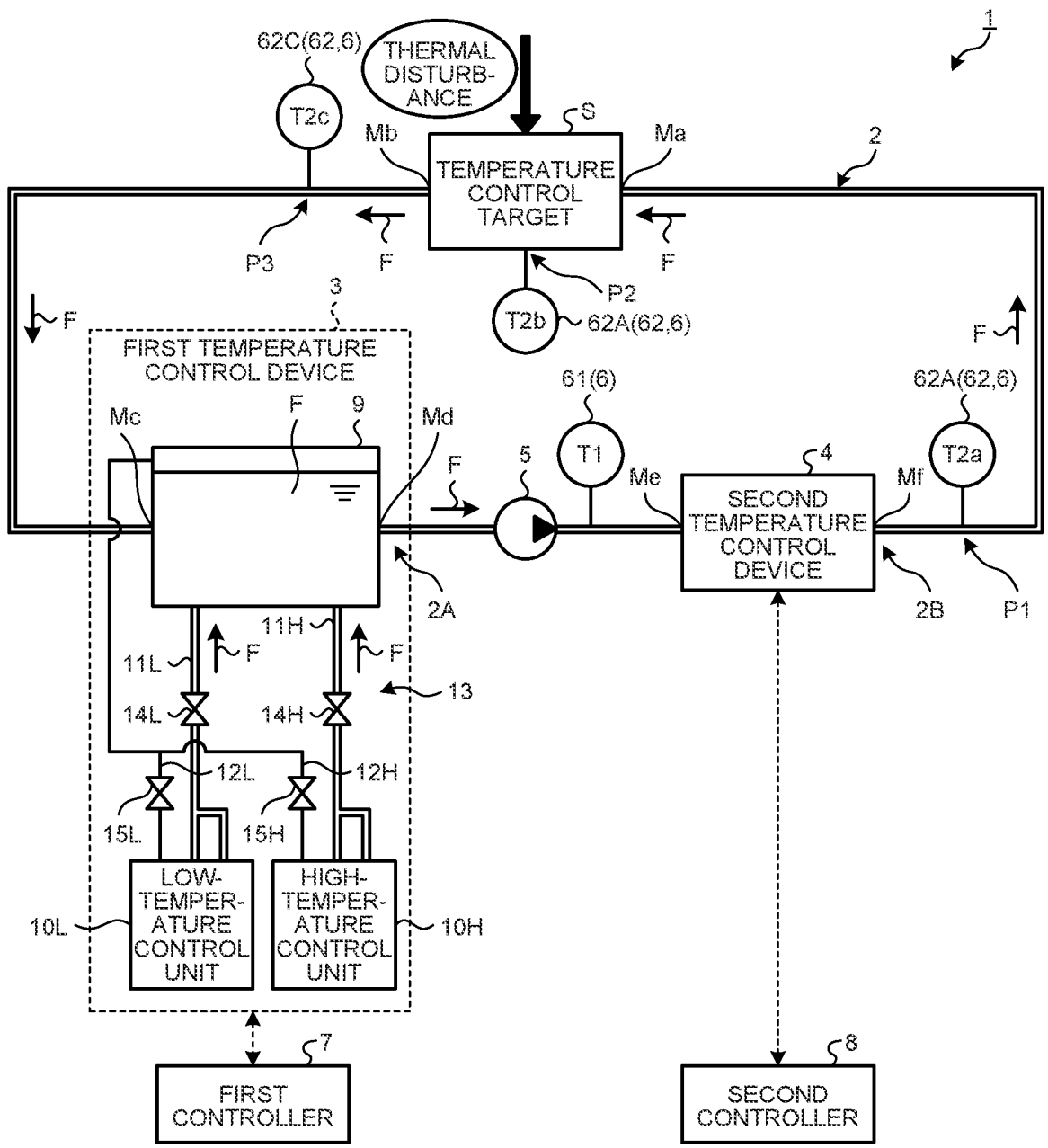
FIG. 1 is a configuration diagram illustrating a temperature control system according to a first embodiment.

FIG. 1 is a configuration diagram illustrating a temperature control system 1 according to the present embodiment. As illustrated in FIG. 1, the temperature control system 1 includes a circulation flow path 2 that includes a temperature control target S and through which fluid F flows, a first temperature control device 3 that adjusts the temperature of the fluid F in a first portion 2A of the circulation flow path 2, a second temperature control device 4 that adjusts the temperature of the fluid F in a second portion 2B of the circulation flow path 2 between the first portion 2A and the temperature control target S, a pump 5 that causes the fluid F to flow in the circulation flow path 2, a temperature sensor 6 that detects the temperature of the fluid F, a first controller 7 that controls the first temperature control device 3, and a second controller 8 that controls the second temperature control device 4.

The temperature control target S includes at least a part of a semiconductor manufacturing apparatus. The temperature control target S includes, for example, a wafer holder of a plasma processing apparatus. The wafer holder holds a semiconductor wafer subjected to plasma processing in the plasma processing apparatus. The wafer holder is made of, for example, aluminum. The wafer holder includes an electrostatic chuck that holds a semiconductor wafer with electrostatic adsorption power. The electrostatic chuck adsorbs and holds the semiconductor wafer by Coulomb force when a DC voltage is applied. By controlling the temperature of the wafer holder, the temperature of the semiconductor wafer held by the wafer holder is adjusted.

The temperature control system 1 controls the temperature of the temperature control target S by supplying the fluid F to the temperature control target S. In the present embodiment, the fluid F is liquid. Note that the fluid F may be gas. In the circulation flow path 2, the fluid F is supplied from the first temperature control device 3 to the second temperature control device 4 and then supplied to the temperature control target S. The fluid F supplied to the temperature control target S is returned to the first temperature control device 3.

The temperature control target S has an inlet Ma into which the fluid F from the second temperature control device 4 flows and an outlet Mb from which the fluid F flows out. The first temperature control device 3 has an inlet Mc into which the fluid F from the temperature control target S flows and an outlet Md from which the fluid F flows out. The second temperature control device 4 has an inlet Me into which the fluid F from the first temperature control device 3 flows and an outlet Mf from which the fluid F flows out. The inlet Mc of the first temperature control device 3 is also an inlet of the first portion 2A. The outlet Md of the first temperature control device 3 is also an outlet of the first portion 2A. The inlet Me of the second temperature control device 4 is also an inlet of the second portion 2B. The outlet Mf of the second temperature control device 4 is also an outlet of the second portion 2B.

The first temperature control device 3 is a so-called rough temperature control device. The second temperature control device 4 is a so-called fine temperature control device. The temperature adjustable range (gain) by the first temperature control device 3 is wider than the temperature adjustable range by the second temperature control device 4. As an example, the temperature adjustable range by the first temperature control device 3 is ±50° C., and the temperature adjustable range by the second temperature control device 4 is ±1° C. The response speed (responsiveness) of the second temperature control device 4 is higher than the response speed of the first temperature control device 3. The response speed refers to a time required for the temperature of the fluid F to reach a target temperature. A high response speed means that the time required for the temperature of the fluid F to reach a target temperature is short. A low response speed means that the time required for the temperature of the fluid F to reach a target temperature is long.

A tank 9 is disposed in the circulation flow path 2. In the embodiment, the first portion 2A includes the tank 9 disposed in the circulation flow path 2. The inlet Mc and the outlet Md are included in the tank 9.

The first temperature control device 3 supplies at least one of the fluid F having a first temperature $T_L$ or the fluid F having a second temperature $T_H$ higher than the first temperature $T_L$ to the tank 9 of the circulation flow path 2 to adjust the temperature of the fluid F in the tank 9. The first temperature control device 3 roughly adjusts the temperature of the fluid F.

The second temperature control device 4 adjusts the temperature of the fluid F supplied to the temperature control target S in the second portion 2B of the circulation flow path 2 between the tank 9 and the temperature control target S. The second temperature control device 4 adjusts the temperature of the fluid F with high accuracy.

The pump 5 is disposed in the circulation flow path 2 between the tank 9 and the second temperature control device 4. When the pump 5 is driven, the fluid F circulates in the circulation flow path 2.

The temperature sensor 6 includes a first temperature sensor 61 that detects a temperature T1 of the fluid F supplied from the first portion 2A to the second portion 2B and a second temperature sensor 62 that detects a temperature T2 of the temperature control target S or the fluid F or at a predetermined position in the circulation flow path 2 between the outlet Mf of the second portion 2B (second temperature control device 4) and the inlet Mc of the first portion 2A (first temperature control device 3).

The predetermined position of the circulation flow path 2 where the temperature T2 of the fluid F is detected by the second temperature sensor 62 includes a first predetermined position P1 set between the second portion 2B and the temperature control target S and a second predetermined position P2 and a third predetermined position P3 set between the inlet Ma of the temperature control target S and the inlet Mc of the first portion 2A. The second temperature sensor 62 includes a second temperature sensor 62A that detects a temperature T2a of the fluid F at the first predetermined position P1 set between the second portion 2B and the temperature control target S, a second temperature sensor 62B that detects a temperature T2b of the temperature control target S at the second predetermined position P2 set in the temperature control target S, and a second temperature sensor 62C that detects a temperature T2c of the fluid F at the third predetermined position P3 set between the temperature control target S and the first portion 2A.

<First Temperature Control Device>

The first temperature control device 3 includes a low-temperature control unit 10L that stores the fluid F having the first temperature $T_L$, a high-temperature control unit 10H that stores the fluid F having the second temperature $T_H$ higher than the first temperature $T_L$, a low-temperature flow path 11L through which the fluid F supplied from the low-temperature control unit 10L to the tank 9 flows, a high-temperature flow path 11H through which the fluid F supplied from the high-temperature control unit 10H to the tank 9 flows, a low-temperature overflow channel 12L through which the fluid F returned from the tank 9 to the low-temperature control unit 10L flows, a high-temperature overflow channel 12H through which the fluid F returned from the tank 9 to the high-temperature control unit 10H flows, and a valve system 13 that adjusts a flow rate of the fluid F flowing through the low-temperature flow path 11L and a flow rate of the fluid flowing through the high-temperature flow path 11H.

The low-temperature control unit 10L stores the fluid F having the first temperature $T_L$. The low-temperature control unit 10L can send the fluid F having the first temperature $T_L$ to the tank 9. The low-temperature control unit 10L includes a low-temperature tank, a low-temperature controller, and a low-temperature pump that sends out the fluid F. The low-temperature controller includes a heat exchanger. The low-temperature controller adjusts the temperature of the fluid F to the first temperature $T_L$. The fluid F adjusted to the first temperature $T_L$ is stored in the low-temperature tank. As an example, the first temperature $T_L$ is 5° C.

The high-temperature control unit 10H stores the fluid F having the second temperature $T_H$ higher than the first temperature $T_L$. The high-temperature control unit 10H can send the fluid F having the second temperature $T_H$ to the tank 9. The high-temperature control unit 10H includes a high-temperature tank, a high-temperature controller, and a high-temperature pump that sends out the fluid F. The high-temperature controller includes a heat exchanger. The high-temperature controller adjusts the temperature of the fluid F to the second temperature $T_H$. The fluid F adjusted to the second temperature $T_H$ is stored in the high-temperature tank. As an example, the second temperature $T_H$ is 90° C.

The low-temperature flow path 11L connects the low-temperature control unit 10L and the tank 9. The low-temperature control unit 10L can supply the fluid F having the first temperature $T_L$ to the tank 9 via the low-temperature flow path 11L. The fluid F supplied from the low-temperature control unit 10L to the tank 9 flows through the low-temperature flow path 11L.

The high-temperature flow path 11H connects the high-temperature control unit 10H and the tank 9. The high-temperature control unit 10H can supply the fluid F having the second temperature $T_H$ to the tank 9 via the high-temperature flow path 11H. The fluid F supplied from the high-temperature control unit 10H to the tank 9 flows through the high-temperature flow path 11H.

The valve system 13 can switch among a first state in which the fluid F is supplied neither from the low-temperature control unit 10L nor the high-temperature control unit 10H to the tank 9, a second state in which the fluid F is supplied from the low-temperature control unit 10L to the tank 9, and a third state in which the fluid F is supplied from the high-temperature control unit 10H to the tank 9. The first state is a state in which the fluid F is supplied neither from the low-temperature control unit 10L nor the high-temperature control unit 10H to the tank 9. The second state is a state in which the fluid F at the first temperature $T_L$ is supplied from the low-temperature control unit 10L to the tank 9 and the fluid F is not supplied from the high-temperature control unit 10H to the tank 9. The third state is a state in which the fluid F at the second temperature $T_H$ is supplied from the high-temperature control unit 10H to the tank 9 and the fluid F is not supplied from the low-temperature control unit 10L to the tank 9.

In addition, the valve system 13 can switch among a fourth state in which the fluid F is returned, from the tank 9, to neither the low-temperature control unit 10L nor the high-temperature control unit 10H, a fifth state in which the fluid F is returned from the tank 9 to the low-temperature control unit 10L, and a sixth state in which the fluid F is returned from the tank 9 to the high-temperature control unit 10H. The fourth state is a state in which the fluid F not returned from the tank 9 to neither the low-temperature control unit 10L nor the high-temperature control unit 10H. The fifth state is a state in which the fluid F is returned from the tank 9 to the low-temperature control unit 10L and the fluid F is not returned from the tank 9 to the high-temperature control unit 10H. The sixth state is a state in which the fluid F is returned from the tank 9 to the high-temperature control unit 10H and the fluid F is not returned from the tank 9 to the low-temperature control unit 10L.

The valve system 13 is controlled by the first controller 7. The first controller 7 controls the valve system 13 of the first temperature control device 3 on the basis of a detection value of the first temperature sensor 61 so that the temperature of the fluid F supplied from the first portion 2A (tank 9) to the second portion 2B (second temperature control device 4) becomes a first target temperature SV1. The valve system 13 controls the valve system 13 so that the fluid F in the tank 9 becomes the first target temperature SV1 and adjusts the flow rate of the fluid F flowing through the low-temperature flow path 11L from the low-temperature control unit 10L toward the tank 9 and the flow rate of the fluid F flowing through the high-temperature flow path 11H from the high-temperature control unit 10H toward the tank 9.

The valve system 13 includes a low-temperature flow rate adjusting valve 14L disposed in the low-temperature flow path 11L, a high-temperature flow rate adjusting valve 14H disposed in the high-temperature flow path 11H, a low-temperature on-off valve 15L disposed in the low-temperature overflow channel 12L, and a high-temperature on-off valve 15H disposed in the high-temperature overflow channel 12H.

The low-temperature flow rate adjusting valve 14L is controlled by the first controller 7. The first controller 7 can switch between supply and stop of the fluid F from the low-temperature control unit 10L to the tank 9 and adjust the flow rate of the fluid F supplied from the low-temperature control unit 10L to the tank 9 by controlling the low-temperature flow rate adjusting valve 14L. When the low-temperature flow rate adjusting valve 14L is opened, the fluid F at the first temperature $T_L$ is supplied from the low-temperature control unit 10L to the tank 9. When the low-temperature flow rate adjusting valve 14L is closed, the supply of the fluid F from the low-temperature control unit 10L to the tank 9 is stopped.

The high-temperature flow rate adjusting valve 14H is controlled by the first controller 7. The first controller 7 can switch between supply and stop of the fluid F from the high-temperature control unit 10H to the tank 9 and adjust the flow rate of the fluid F supplied from the high-temperature control unit 10H to the tank 9 by controlling the high-temperature flow rate adjusting valve 14H. When the high-temperature flow rate adjusting valve 14H is opened, the fluid F at the second temperature $T_H$ is supplied from the high-temperature control unit 10H to the tank 9. When the high-temperature flow rate adjusting valve 14H is closed, the supply of the fluid F from the high-temperature control unit 10H to the tank 9 is stopped.

The low-temperature flow rate adjusting valve 14L may be a proportional valve or an on-off valve. A proportional valve can perform flow rate control of the fluid F with high accuracy. Therefore, in a case where a proportional valve is used as the low-temperature flow rate adjusting valve 14L, the temperature control of the fluid F in the tank 9 can be performed with high accuracy. Note that in a case where highly accurate flow rate control of the fluid F or highly accurate temperature control of the fluid F in the tank 9 is not required, an inexpensive on-off valve may be used as the low-temperature flow rate adjusting valve 14L. Similarly, the high-temperature flow rate adjusting valve 14H may be a proportional valve or an on-off valve.

The low-temperature on-off valve 15L is an on-off valve. When the low-temperature on-off valve 15L is opened, the fluid F is returned from the tank 9 to the low-temperature control unit 10L. When the low-temperature on-off valve 15L is closed, the fluid F is not returned from the tank 9 to the low-temperature control unit 10L. The on-off valve is, for example, an electromagnetic valve.

The high-temperature on-off valve 15H is an on-off valve. When the high-temperature on-off valve 15H is opened, the fluid F is returned from the tank 9 to the high-temperature control unit 10H. When the high-temperature on-off valve 15H is closed, the fluid F is not returned from the tank 9 to the high-temperature control unit 10H. The on-off valve is, for example, an electromagnetic valve.

The first controller 7 closes both of the low-temperature flow rate adjusting valve 14L and the high-temperature flow rate adjusting valve 14H when bringing the flowing state of the fluid F to the first state. As a result, the fluid F is not supplied to the tank 9 from each of the low-temperature control unit 10L and the high-temperature control unit 10H.

The first controller 7 opens the low-temperature flow rate adjusting valve 14L and closes the high-temperature flow rate adjusting valve 14H when bringing the flowing state of the fluid F to the second state. As a result, the fluid F at the first temperature $T_L$ sent from the low-temperature control unit 10L is supplied to the tank 9 at a prescribed flow rate via the low-temperature flow path 11L.

The first controller 7 opens the high-temperature flow rate adjusting valve 14H and closes the low-temperature flow rate adjusting valve 14L when bringing the flowing state of the fluid F to the third state. As a result, the fluid F at the second temperature $T_H$ sent from the high-temperature control unit 10H is supplied to the tank 9 at a prescribed flow rate via the high-temperature flow path 11H.

The first controller 7 closes each of the low-temperature on-off valve 15L and the high-temperature on-off valve 15H when bringing the flowing state of the fluid F to the fourth state. As a result, the fluid F is not returned from the tank 9 to either the low-temperature control unit 10L or the high-temperature control unit 10H.

The first controller 7 opens the low-temperature on-off valve 15L and closes the high-temperature on-off valve 15H when bringing the flowing state of the fluid F to the fifth state. As a result, at least a part of the fluid F stored in the tank 9 is returned to the low-temperature control unit 10L via the low-temperature overflow channel 12L.

The first controller 7 opens the high-temperature on-off valve 15H and closes the low-temperature on-off valve 15L when bringing the flowing state of the fluid F to the sixth state. As a result, at least a part of the fluid F stored in the tank 9 is returned to the high-temperature control unit 10H via the high-temperature overflow channel 12H.

<Second Temperature Control Device>

Figure 2:
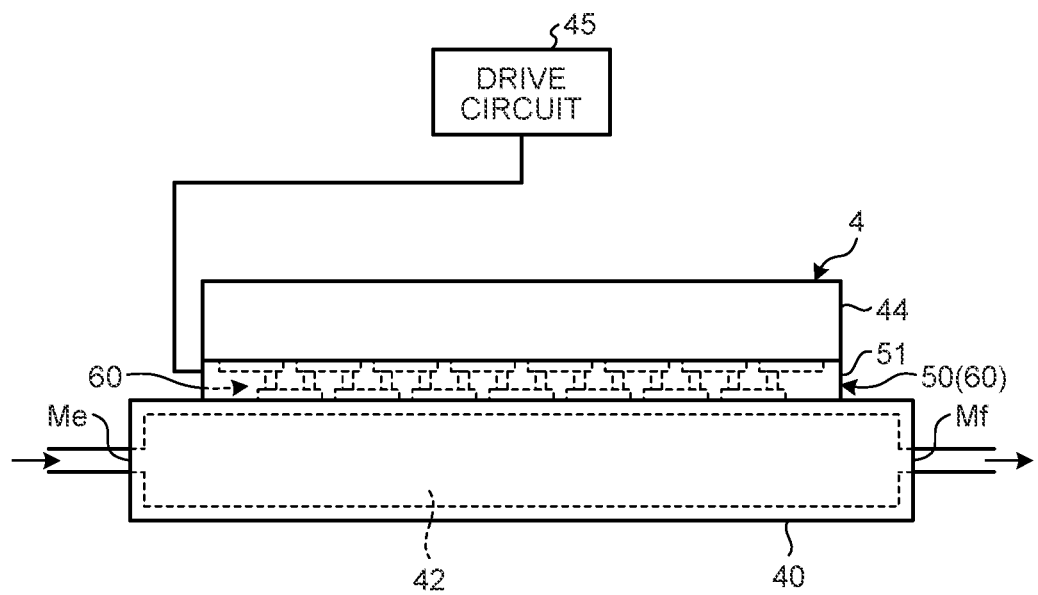
FIG. 2 is a diagram schematically illustrating a second temperature control device according to the first embodiment.

FIG. 2 is a diagram schematically illustrating the second temperature control device 4 according to the present embodiment. The second temperature control device 4 includes thermoelectric modules 60. As illustrated in FIG. 2, the second temperature control device 4 includes a body member 40 having a temperature control flow path 42, a temperature control unit 50 having the thermoelectric modules 60 connected to the body member 40, a heat exchange plate 44 connected to the temperature control unit 50, and a drive circuit 45 that drives the temperature control unit 50.

The temperature control flow path 42 is included inside the body member 40. The fluid F from the tank 9 flows into the temperature control flow path 42 via the inlet Me. The fluid F having flowed through the temperature control flow path 42 flows out of the temperature control flow path 42 via the outlet Mf. The fluid F flowed out of the temperature control flow path 42 is supplied to the temperature control target S.

The temperature control unit 50 adjusts the temperature of the fluid F flowing through the temperature control flow path 42 via the body member 40. The temperature control unit 50 includes the thermoelectric modules 60. The temperature control unit 50 adjusts the temperature of fluid F using the thermoelectric modules 60.

The thermoelectric modules 60 absorb heat or generate heat to adjust the temperature of the fluid F flowing through the temperature control flow path 42. The thermoelectric modules 60 absorb heat or generate heat by supplying electric power. The thermoelectric modules 60 absorb heat or generate heat by the Peltier effect.

The heat exchange plate 44 exchanges heat with the temperature control unit 50. The heat exchange plate 44 has an internal flow path (not illustrated) through which a temperature control medium flows. The temperature control medium flows into the internal flow path of the heat exchange plate 44 after being temperature-regulated by a medium temperature controlling device (not illustrated). The temperature control medium flows through the internal flow path and thereby takes heat from the heat exchange plate 44 or provides heat to the heat exchange plate 44. The temperature control medium flows out of the internal flow path and is returned to the fluid temperature control device.

Figure 3:
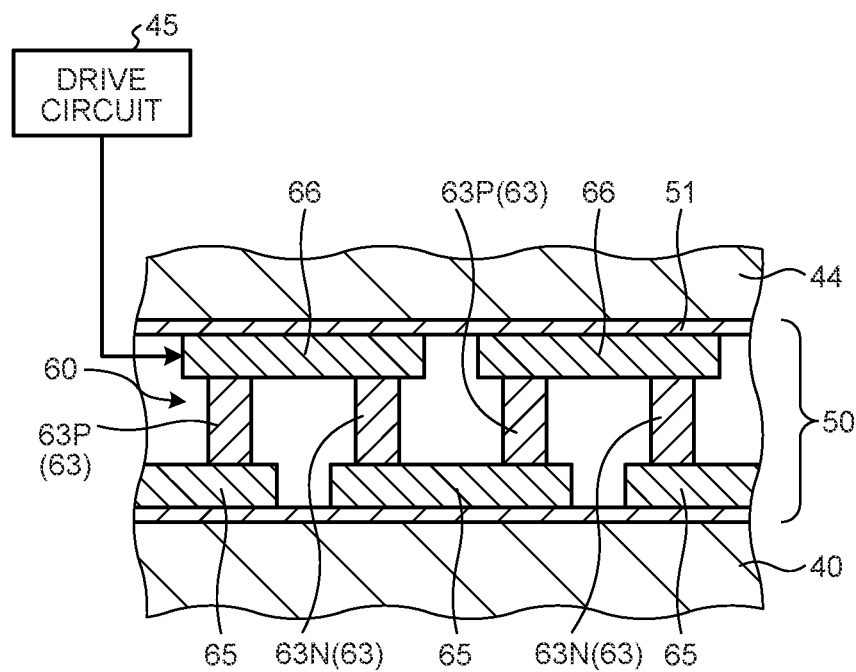
FIG. 3 is an enlarged cross-sectional view of a part of a temperature control unit according to the first embodiment.

FIG. 3 is an enlarged cross-sectional view of a part of the temperature control unit 50 according to the present embodiment. As illustrated in FIG. 3, the temperature control unit 50 includes a plurality of thermoelectric modules 60 and a case 51 accommodating the plurality of thermoelectric modules 60. One end face of the case 51 is connected with the body member 40. The other end face of the case 51 is connected with the heat exchange plate 44.

A thermoelectric module 60 includes a first electrode 65, second electrodes 66, and thermoelectric semiconductor elements 63. The thermoelectric semiconductor elements 63 includes a p-type thermoelectric semiconductor element 63P and an n-type thermoelectric semiconductor element 63N. The first electrode 65 is connected to each of the p-type thermoelectric semiconductor element 63P and the n-type thermoelectric semiconductor element 63N. The second electrodes 66 are each connected to one of the p-type thermoelectric semiconductor element 63P and the n-type thermoelectric semiconductor element 63N. The first electrode 65 is adjacent to the body member 40. The second electrodes 66 are adjacent to the heat exchange plate 44. One end face of the p-type thermoelectric semiconductor element 63P and one end face of the n-type thermoelectric semiconductor element 63N are each connected to the first electrode 65. The other end face of the p-type thermoelectric semiconductor element 63P and the other end face of the n-type thermoelectric semiconductor element 63N are each connected to one of the second electrodes 66.

The thermoelectric modules 60 absorb heat or generate heat by the Peltier effect. The drive circuit 45 supplies, to the thermoelectric modules 60, electric power for causing the thermoelectric modules 60 to absorb heat or to generate heat. The drive circuit 45 applies a potential difference between the first electrode 65 and the second electrodes 66. When a potential difference is applied between the first electrode 65 and the second electrodes 66, electric charges are transferred in the thermoelectric semiconductor elements 63. The transfer of electric charges causes transfer of heat in the thermoelectric semiconductor elements 63. As a result, the thermoelectric module 60 absorbs heat or generates heat. For example, when a potential difference is applied between the first electrodes 65 and the second electrodes 66 so that the first electrodes 65 generate heat and the second electrodes 66 absorb heat, the fluid F flowing through the temperature control flow path 42 is heated. When a potential difference is applied between the first electrodes 65 and the second electrodes 66 so that the first electrodes 65 absorb heat and the second electrodes 66 generate heat, the fluid F flowing through the temperature control flow path 42 is cooled.

The drive circuit 45 applies electric power (potential difference) to the thermoelectric modules 60. The drive circuit 45 is controlled by the second controller 8. The second controller 8 controls the thermoelectric modules 60 by controlling the drive circuit 45. The amount of heat absorbed or generated by thermoelectric modules 60 is adjusted through adjustment of the electric power supplied to thermoelectric modules 60. The temperature of the fluid F flowing through the temperature control flow path 42 is adjusted through adjustment of the amount of heat absorbed or generated by the thermoelectric modules 60.

The second controller 8 controls the thermoelectric modules 60 of the second temperature control device 4 on the basis of a detection value of the second temperature sensor 62 so that the temperature of the fluid F becomes the second target temperature SV2 at a predetermined position in the circulation flow path 2.

<Control Method>

Figure 4:
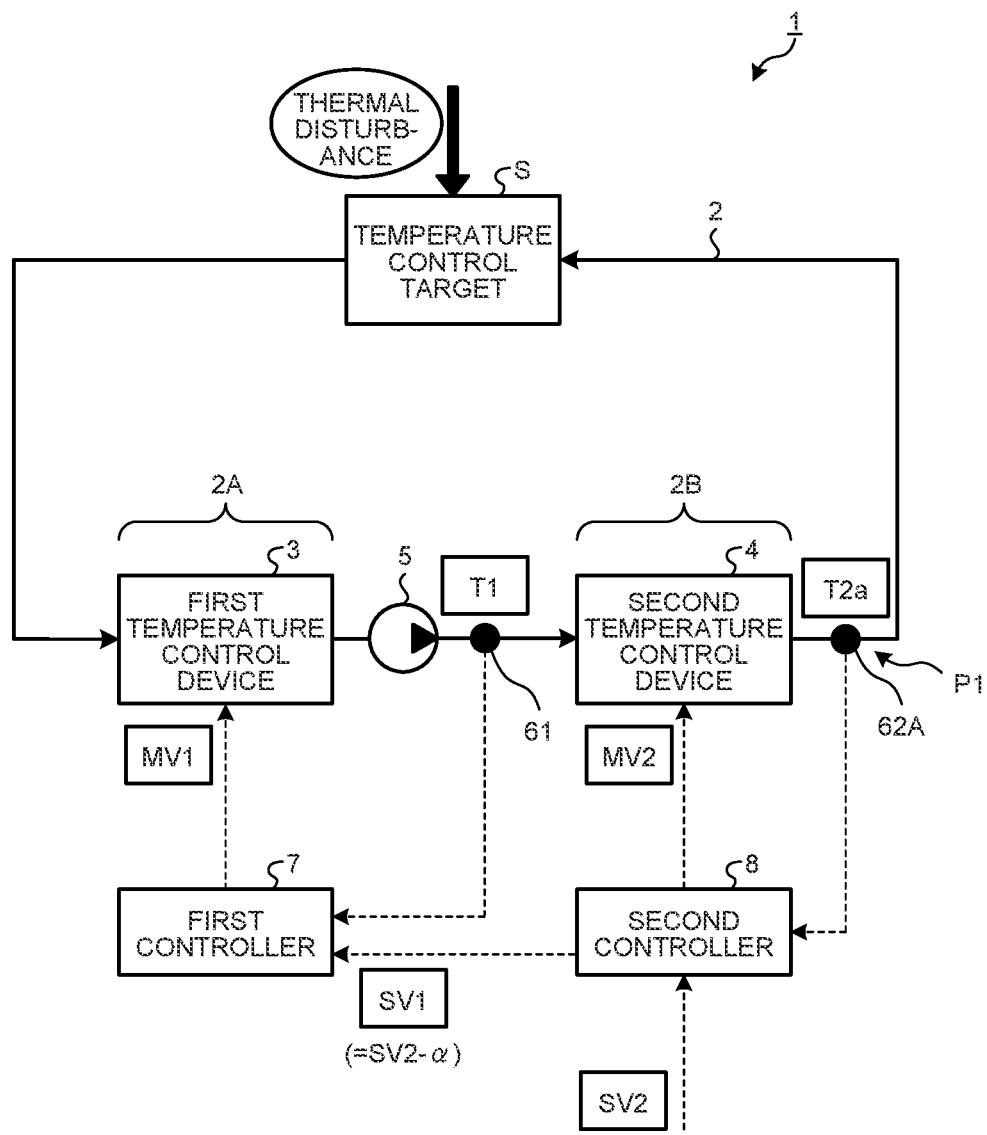
FIG. 4 is a block diagram illustrating a temperature control system according to the first embodiment.

FIG. 4 is a block diagram illustrating the temperature control system 1 according to the present embodiment. In the present embodiment, a control method for bringing the temperature of the fluid F at the first predetermined position P1 between the second temperature control device 4 and the temperature control target S to the second target temperature SV2 will be described.

As illustrated in FIG. 4, the temperature control system 1 includes: the circulation flow path 2 including the temperature control target S; the first temperature control device 3 that supplies at least one of the fluid F having the first temperature $T_L$ and the fluid F having the second temperature $T_H$ higher than the first temperature $T_L$ to the first portion 2A of the circulation flow path 2 to adjust the temperature of the fluid F in the first portion 2A; the second temperature control device 4 that adjusts the temperature of the fluid F supplied to the temperature control target S in the second portion 2B of the circulation flow path 2 between the first portion 2A and the temperature control target S; the first temperature sensor 61 that detects the temperature of the fluid F supplied from the first portion 2A to the second portion 2B; the second temperature sensor 62A that detects the temperature of the fluid F at the first predetermined position P1 in the circulation flow path 2 between the second portion 2B and the temperature control target S; the first controller 7 that controls the first temperature control device 3 so that the temperature of the fluid F supplied from the first portion 2A to the second portion 2B becomes the first target temperature SV1 on the basis of a detection value of the first temperature sensor 61; and the second controller 8 that controls the second temperature control device 4 so that the temperature of the fluid F becomes the second target temperature SV2 at the first predetermined position P1 in the circulation flow path 2 between the second portion 2B and the temperature control target S on the basis of the detection value of the second temperature sensor 62A.

The first temperature control device 3 and the second temperature control device 4 are connected in series in the circulation flow path 2. The outlet Mf of the second temperature control device 4 is connected to the inlet Ma of the temperature control target S via the flow path of the circulation flow path 2. The outlet Mb of the temperature control target S is connected to the inlet Mc of the first temperature control device 3 via the flow path of the circulation flow path 2.

The response speed of the first temperature control device 3 is slower than the response speed of the temperature control target S. The response speed of the second temperature control device 4 is faster than the response speed of the temperature control target S. The temperature controllable range of the first temperature control device 3 is larger than the temperature controllable range of the second temperature control device 4.

In a case where the temperature control target S is a wafer holder of a plasma processing apparatus, the temperature control target S receives thermal disturbance due to plasma. When the temperature control target S receives thermal disturbance, the temperature of the fluid F in at least a part of the circulation flow path 2 may increase. The temperature control system 1 suppresses fluctuation of the temperature of the fluid F even when the temperature control target S receives thermal disturbance.

The first controller 7 feedback-controls the first temperature control device 3 on the basis of a detection value of the first temperature sensor 61 so that the temperature of the fluid F flowing out of the first temperature control device 3 becomes the first target temperature SV1. That is, the first controller 7 feeds back the temperature T1 which is the detection value of the first temperature sensor 61, calculates a manipulated variable MV1 from a deviation from the first target temperature SV1, and controls the first temperature control device 3 on the basis of the manipulated variable MV1.

The second controller 8 feedback-controls the second temperature control device 4 on the basis of a detection value of the second temperature sensor 62A so that the temperature of the fluid F flowing out of the second temperature control device 4 becomes the second target temperature SV2. That is, the second controller 8 feeds back the temperature T2a which is the detection value of the second temperature sensor 62A, calculates a manipulated variable MV2 from a deviation from the second target temperature SV2, and controls the second temperature control device 4 on the basis of the manipulated variable MV2.

The temperature of the fluid F controlled by the first controller 7 is a so-called outlet temperature of the first temperature control device 3. Note that the temperature of the fluid F controlled by the first controller 7 may be regarded as a so-called inlet temperature of the second temperature control device 4.

The temperature of the fluid F controlled by the second controller 8 is a so-called inlet temperature of the temperature control target S. Note that the temperature of the fluid F controlled by the second controller 8 may be regarded as a so-called outlet temperature of the second temperature control device 4.

The second target temperature SV2 is a target temperature of the temperature control target S. The target temperature of the temperature control target S is to be changed. In a case where the temperature control target S is a wafer holder of a plasma processing apparatus, the target temperature of the temperature control target S is determined on the basis of the process of plasma processing. The target temperature of the temperature control target S is changed during the plasma processing process such as 20° C., 60° C., or 80° C.

In the present embodiment, the first target temperature SV1 is determined on the basis of the second target temperature SV2. The first target temperature SV1 is a function of the second target temperature SV2.

The second controller 8 determines the first target temperature SV1 on the basis of the second target temperature SV2 and outputs the first target temperature SV1 to the first controller 7. Note that the first target temperature SV1 may be determined by the first controller 7.

In the present embodiment, the first target temperature SV1 is determined on the basis of the second target temperature SV2 and a specified value α related to the temperature control capability of the second temperature control device 4. The specified value α is zero or a positive value (α≥0). In the present embodiment, [SV1=SV2−α].

In the present embodiment, the second temperature control device 4 includes the thermoelectric modules 60. The temperature adjustable range of the thermoelectric modules 60 is wide at low temperatures and narrow at high temperatures. The specified value α is set to a larger value as the second target temperature SV2 is lower and is set to a smaller value as the second target temperature SV2 is higher.

Figure 5:
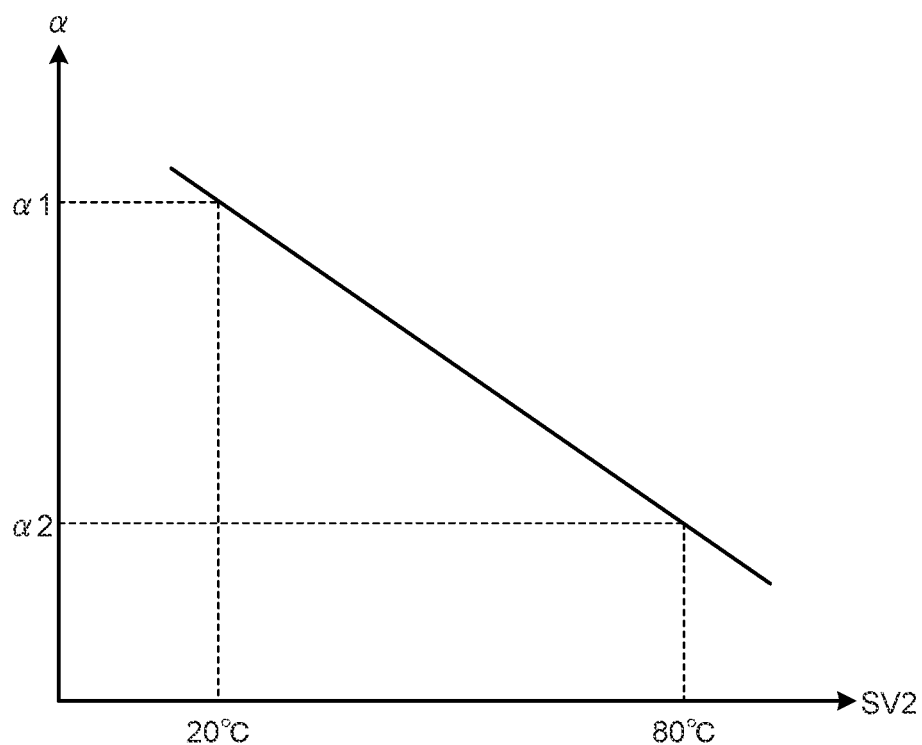
FIG. 5 is a graph for explaining a specified value according to the first embodiment.

FIG. 5 is a graph for explaining the specified value α according to the embodiment. As illustrated in FIG. 5, the specified value α is set so as to decrease as the second target temperature SV2 increases. For example, in a case where the second target temperature SV2 is 20° C., the specified value α is determined to be a value α1. In a case where the second target temperature SV2 is 80° C., the specified value α is determined to be a value α2 smaller than the value α1. The relationship between the specified value α and the second target temperature SV2 is known data determined on the basis of the temperature control capability (specification) of the second temperature control device 4.

In a case where the second target temperature SV2 is 20° C., the first target temperature SV1 is [SV2−α1]. In a case where the second target temperature SV2 is 80° C., the first target temperature SV1 is [SV2−α2]. A relationship of [SV2−α1]<[SV2−α2] holds. The lower the second target temperature SV2 is, the larger the difference between the first target temperature SV1 and the second target temperature SV2 is. The higher the second target temperature SV2 is, the smaller the difference between the first target temperature SV1 and the second target temperature SV2 is. That is, as the second target temperature SV2 is lower, the temperature of the fluid F adjusted by the first temperature control device 3 may be more far from the second target temperature SV2 (target temperature of the temperature control target S). As the second target temperature SV2 is higher, the temperature of the fluid F adjusted by the first temperature control device 3 needs to be closer to the second target temperature SV2 (target temperature of the temperature control target S).

Since the temperature adjustable range of the thermoelectric module 60 is large in a case where the second target temperature SV2 is low, the second temperature control device 4 can adjust the temperature of the fluid F supplied from the first temperature control device 3 to the second target temperature SV2 even in a case where the temperature of the fluid F adjusted by the first temperature control device 3 is far from the second target temperature SV2.

Since the temperature of the fluid F adjusted by the first temperature control device 3 approaches the second target temperature SV2 in a case where the second target temperature SV2 is high, the second temperature control device 4 can adjust the fluid F supplied from the first temperature control device 3 to the second target temperature SV2 even in a case where the temperature adjustable range of the thermoelectric modules 60 is narrow.

<Effects>

As described above, according to the present embodiment, in a case where the temperature of the temperature control target S is adjusted by the fluid F circulating in the circulation flow path 2, the first temperature control device 3 and the second temperature control device 4 are provided in the circulation flow path 2. As a result, the temperature control system 1 can control the temperature of the fluid F with high accuracy.

As described above, the target temperature (second target temperature SV2) of the temperature control target S may be changed during the process. When the target temperature of the temperature control target S is changed, the first temperature control device 3 having a wide temperature adjustable range adjusts the temperature of the fluid F close to the target temperature of the temperature control target S, and the second temperature control device 4 having a high response speed finely adjusts the temperature of the fluid F to stabilize the temperature to the target temperature of the temperature control target S. As a result, the temperature of the fluid F supplied to the temperature control target S is controlled to the target temperature of the temperature control target S with high accuracy. In addition, in a case where the temperature control target S receives thermal disturbance, the first temperature control device 3 can attenuate the fluctuation of the temperature of the fluid F, and the second temperature control device 4 can finely adjust the temperature of the fluid F.

The first target temperature SV1 is determined on the basis of the second target temperature SV2 and the specified value α. As a result, the second temperature control device 4 can appropriately finely adjust the temperature of the fluid F.

Second Embodiment

A second embodiment will be described. In the following description, the same or equivalent components as those of the above embodiment are denoted by the same symbols, and description thereof is simplified or omitted.

Figure 6:
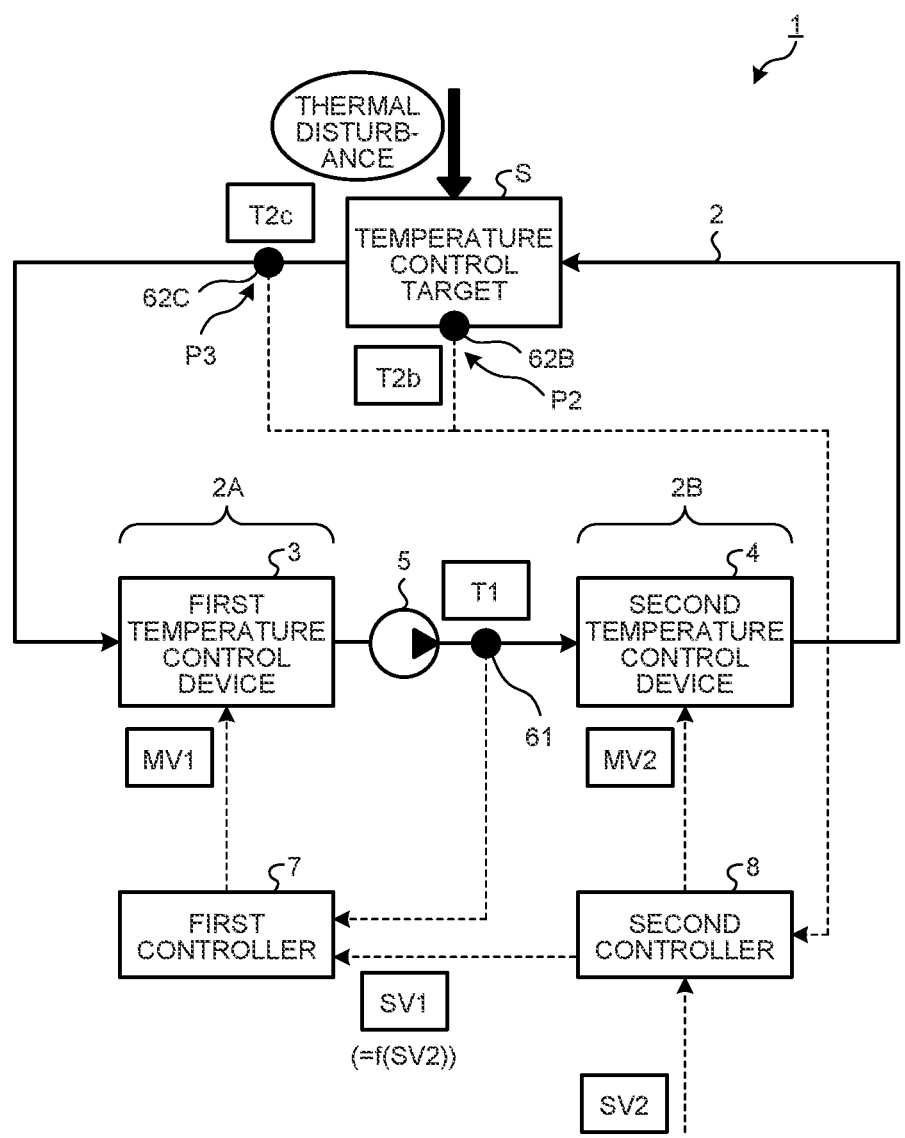
FIG. 6 is a block diagram illustrating a temperature control system according to a second embodiment.

FIG. 6 is a block diagram illustrating a temperature control system 1 according to the present embodiment. In the present embodiment, a control method for bringing the temperature of the fluid F at the temperature control target S at the second predetermined position P2 between the inlet Ma of the temperature control target S and the inlet Mc of the first temperature control device 3 or at the third predetermined position P3 to the second target temperature SV2 will be described. The second predetermined position P2 is set at the temperature control target S. The third predetermined position P3 is set between the outlet Mb of the temperature control target S and the inlet Mc of the first temperature control device 3. Hereinafter, a control method for bringing the temperature of the fluid F at the third predetermined position P3 to the second target temperature SV2 will be described. Note that a control method for bringing the temperature of the temperature control target S at the second predetermined position P2 to the second target temperature SV2 is similar.

As illustrated in FIG. 6, the temperature control system 1 includes: the circulation flow path 2 including the temperature control target S; the first temperature control device 3 that supplies at least one of the fluid F having the first temperature $T_L$ and the fluid F having the second temperature $T_H$ higher than the first temperature $T_L$ to the first portion 2A of the circulation flow path 2 to adjust the temperature of the fluid F in the first portion 2A; the second temperature control device 4 that adjusts the temperature of the fluid F supplied to the temperature control target S in the second portion 2B of the circulation flow path 2 between the first portion 2A and the temperature control target S; the first temperature sensor 61 that detects the temperature of the fluid F supplied from the first portion 2A to the second portion 2B; the second temperature sensor 62C that detects the temperature of the fluid F at the third predetermined position P3 in the circulation flow path 2 between the temperature control target S and the first temperature control device 3; the first controller 7 that controls the first temperature control device 3 so that the temperature of the fluid F supplied from the first portion 2A to the second portion 2B becomes the first target temperature SV1 on the basis of a detection value of the first temperature sensor 61; and the second controller 8 that controls the second temperature control device 4 so that the temperature of the fluid F becomes the second target temperature SV2 at the third predetermined position P3 in the circulation flow path 2 between the temperature control target S and the first temperature control device 3 on the basis of a detection value of the second temperature sensor 62C.

The first controller 7 feedback-controls the first temperature control device 3 on the basis of a detection value of the first temperature sensor 61 so that the temperature of the fluid F flowing out of the first temperature control device 3 becomes the first target temperature SV1. That is, the first controller 7 feeds back the temperature T1 which is the detection value of the first temperature sensor 61, calculates a manipulated variable MV1 from a deviation from the first target temperature SV1, and controls the first temperature control device 3 on the basis of the manipulated variable MV1.

The second controller 8 feedback-controls the second temperature control device 4 on the basis of the detection value of the second temperature sensor 62C so that the temperature of the fluid F flowing out of the second temperature control device 4 becomes the second target temperature SV2. That is, the second controller 8 feeds back the temperature T2c which is the detection value of the second temperature sensor 62C, calculates a manipulated variable MV2 from a deviation from the second target temperature SV2, and controls the second temperature control device 4 on the basis of the manipulated variable MV2.

The temperature of the fluid F controlled by the first controller 7 is a so-called outlet temperature of the first temperature control device 3. Note that the temperature of the fluid F controlled by the first controller 7 may be regarded as a so-called inlet temperature of the second temperature control device 4.

The temperature of the fluid F controlled by the second controller 8 is a so-called outlet temperature of the temperature control target S. Note that the temperature of the fluid F controlled by the second controller 8 may be regarded as a so-called inlet temperature of the first temperature control device 3. Note that in a case where the fluid F at the second predetermined position P2 is brought to the second target temperature SV2, the temperature of the fluid F controlled by the second controller 8 is the temperature of the temperature control target S.

The first target temperature SV1 is determined on the basis on the second target temperature SV2. In the present embodiment, the first target temperature SV1 is determined on the basis of the second target temperature SV2, the specified value α related to the temperature control capability of the second temperature control device 4, and the detection value of the second temperature sensor 62C. The specified value α is similar to the specified value α described in the above embodiment. In the present embodiment, [SV1=SV2−α+(SV2−T2c)].

As described above, according to the present embodiment, the first target temperature SV1 is determined on the basis of the second target temperature SV2, the specified value α related to the temperature control capability of the second temperature control device 4, and the temperature T2c that is the detection value of the second temperature sensor 62C. The temperature T2c of the fluid F flowing out of the temperature control target S may fluctuate due to, for example, thermal disturbance. According to the present embodiment, the first target temperature SV1 is determined in consideration of the fluctuation of the temperature T2c. As a result, for example, even if the target temperature of the temperature control target S is changed during the process, the temperature control system 1 can control the temperature of the fluid F with high accuracy using the first temperature control device 3 and the second temperature control device 4.

Third Embodiment

A third embodiment will be described. In the following description, the same or equivalent components as those of the above embodiment are denoted by the same symbols, and description thereof is simplified or omitted.

Figure 7:
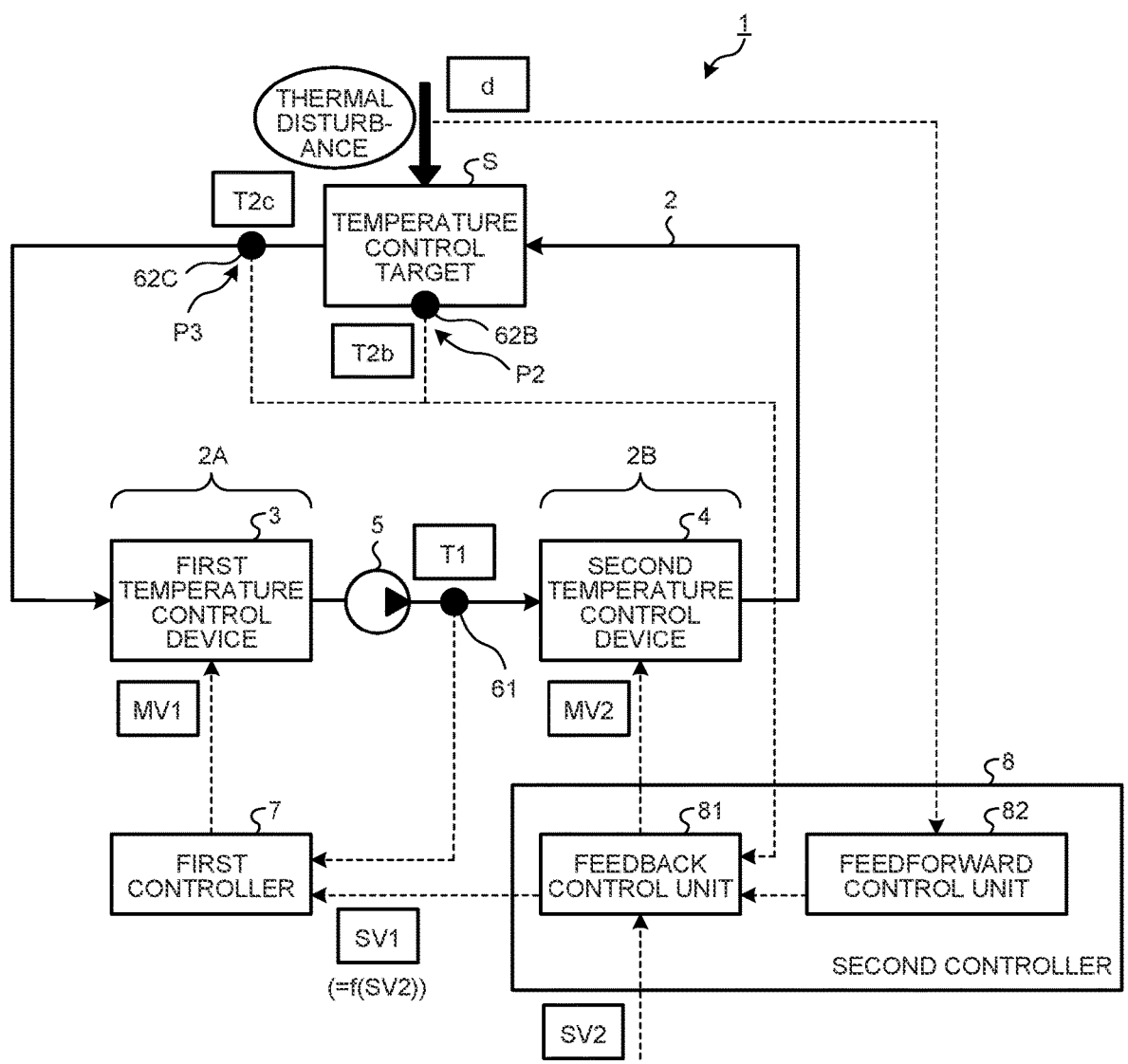
FIG. 7 is a block diagram illustrating a temperature control system according to a third embodiment.

FIG. 7 is a block diagram illustrating a temperature control system 1 according to the present embodiment. Also in the present embodiment, a control method for bringing the temperature of the fluid F at the third predetermined position P3 set between the outlet Mb of the temperature control target S and the inlet Mc of the first temperature control device 3 to the second target temperature SV2 will be described. Note that a control method for bringing the temperature of the temperature control target S at the second predetermined position P2 to the second target temperature SV2 is similar.

As illustrated in FIG. 7, the temperature control system 1 includes the circulation flow path 2 including the temperature control target S, the first temperature control device 3, the second temperature control device 4, the first temperature sensor 61, the second temperature sensor 62C, the first controller 7, and a second controller 8.

In the present embodiment, the second controller 8 includes: a feedback control unit 81 that outputs a control command to the second temperature control device 4 on the basis of a detection value of the second temperature sensor 62C; and a feedforward control unit 82 that outputs a control command to the second temperature control device 4 on the basis of a thermal disturbance drive signal d input to the temperature control target S, a dynamic characteristic model of the temperature control target S, and a dynamic characteristic model of the second temperature control device 4.

The feedback control unit 81 feedback-controls the second temperature control device 4 on the basis of a detection value of the second temperature sensor 62C so that the temperature of the fluid F flowing out of the second temperature control device 4 becomes the second target temperature SV2. That is, the feedback control unit 81 feeds back the temperature T2c, which is the detection value of the second temperature sensor 62C, and calculates a manipulated variable MV2a from the deviation from the second target temperature SV2.

The feedforward control unit 82 feedforward-controls the second temperature control device 4 so that the temperature of the fluid F flowing out of the temperature control target S becomes the second target temperature SV2 on the basis of the thermal disturbance drive signal d input to the temperature control target S, the dynamic characteristic model of the temperature control target S, and the dynamic characteristic model of the second temperature control device 4.

The thermal disturbance drive signal d is a signal that generates thermal disturbance received by the temperature control target S. In a case where the temperature control target S is a wafer holder of a plasma processing apparatus, a thermal disturbance drive signal d for generating plasma is input to the plasma processing apparatus. When the thermal disturbance drive signal d is input to the plasma processing apparatus, plasma is generated, and the temperature control target S receives thermal disturbance due to the plasma. The relationship between the thermal disturbance drive signal d and the thermal disturbance received by the temperature control target S is known data derived by an experiment or the like.

The dynamic characteristic model of the temperature control target S and the dynamic characteristic model of the second temperature control device 4 are derived by an experiment or simulation and stored in the feedforward control unit 82. The feedforward control unit 82 can predict the temperature of the fluid F flowing out of the temperature control target S by inputting the thermal disturbance drive signal d to the dynamic characteristic model of the temperature control target S. The feedforward control unit 82 can also calculate a manipulated variable MV2b for bringing the temperature of the fluid F flowing out of the temperature control target S to the second target temperature SV2 on the basis of the dynamic characteristic model of the second temperature control device 4. That is, the feedforward control unit 82 can calculate the manipulated variable MV2b for canceling the thermal disturbance received by the temperature control target S on the basis of the thermal disturbance drive signal d input to the temperature control target S, the dynamic characteristic model of the temperature control target S, and the dynamic characteristic model of the second temperature control device 4.

The second controller 8 calculates a manipulated variable MV2 by adding up the manipulated variable MV2a calculated by the feedback control unit 81 and the manipulated variable MV2b calculated by the feedforward control unit 82 and controls the second temperature control device 4 on the basis of the manipulated variable MV2.

Note that, in a case where the thermal disturbance drive signal d is zero, the feedforward control unit 82 does not calculate the manipulated variable MV2b.

The first controller 7 feedback-controls the first temperature control device 3 on the basis of a detection value of the first temperature sensor 61 so that the temperature of the fluid F flowing out of the first temperature control device 3 becomes the first target temperature SV1. That is, the first controller 7 feeds back the temperature T1 which is the detection value of the first temperature sensor 61, calculates a manipulated variable MV1 from a deviation from the first target temperature SV1, and controls the first temperature control device 3 on the basis of the manipulated variable MV1.

The first target temperature SV1 is determined on the basis on the second target temperature SV2. As in the second embodiment described above, the first target temperature SV1 is determined on the basis of the second target temperature SV2, a specified value α related to the temperature control capability of the second temperature control device 4, and the detection value of the second temperature sensor 62C. Also in the present embodiment, [SV1=SV2−α+(SV2−T2c)].

As described above, according to the present embodiment, the second controller 8 includes the feedback control unit 81 and the feedforward control unit 82. The feedforward control unit 82 can control the second temperature control device 4 in consideration of thermal disturbance received by the temperature control target S. Therefore, the temperature control system 1 can control the temperature of the fluid F with high accuracy using the first temperature control device 3 and the second temperature control device 4.

Fourth Embodiment

A fourth embodiment will be described. In the following description, the same or equivalent components as those of the above embodiment are denoted by the same symbols, and description thereof is simplified or omitted.

Figure 8:
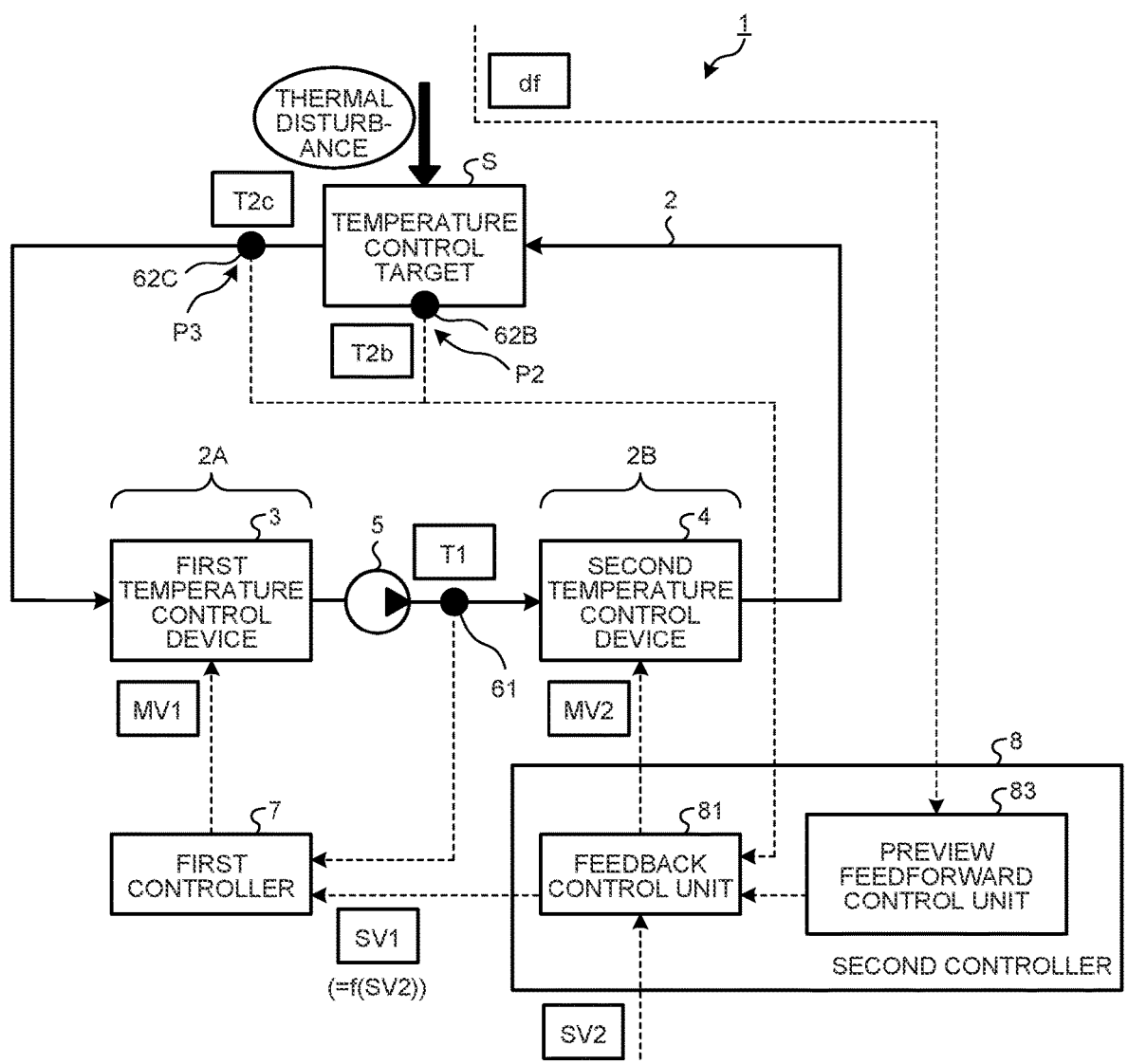
FIG. 8 is a block diagram illustrating a temperature control system according to a fourth embodiment.

FIG. 8 is a block diagram illustrating a temperature control system 1 according to the present embodiment. Also in the present embodiment, a control method for bringing the temperature of the fluid F at the third predetermined position P3 set between the outlet Mb of the temperature control target S and the inlet Mc of the first temperature control device 3 to the second target temperature SV2 will be described. Note that a control method for bringing the temperature of the temperature control target S at the second predetermined position P2 to the second target temperature SV2 is similar.

As illustrated in FIG. 8, the temperature control system 1 includes the circulation flow path 2 including the temperature control target S, the first temperature control device 3, the second temperature control device 4, the first temperature sensor 61, the second temperature sensor 62C, the first controller 7, and a second controller 8.

In the present embodiment, the second controller 8 includes: a feedback control unit 81 that outputs a control command to the second temperature control device 4 on the basis of a detection value of the second temperature sensor 62C; and a preview feedforward control unit 83 that outputs a control command to the second temperature control device 4 on the basis of a thermal disturbance drive future signal df scheduled to be input to the temperature control target S, a dynamic characteristic model of the temperature control target S, and a dynamic characteristic model of the second temperature control device 4.

The feedback control unit 81 feedback-controls the second temperature control device 4 on the basis of a detection value of the second temperature sensor 62C so that the temperature of the fluid F flowing out of the second temperature control device 4 becomes the second target temperature SV2. That is, the feedback control unit 81 feeds back the temperature T2c, which is the detection value of the second temperature sensor 62C, and calculates a manipulated variable MV2a from the deviation from the second target temperature SV2.

The preview feedforward control unit 83 feedforward-controls the second temperature control device 4 so that the temperature of the fluid F flowing out of the temperature control target S becomes the second target temperature SV2 on the basis of the thermal disturbance drive future signal df scheduled to be input to the temperature control target S, the dynamic characteristic model of the temperature control target S, and the dynamic characteristic model of the second temperature control device 4.

The thermal disturbance drive future signal df is a signal that is scheduled to generate thermal disturbance to be received by the temperature control target S. In a case where the temperature control target S is a wafer holder of a plasma processing apparatus, a thermal disturbance drive signal d for generating plasma is input to the plasma processing apparatus. When the thermal disturbance drive signal d is input to the plasma processing apparatus, plasma is generated, and the temperature control target S receives thermal disturbance due to the plasma. The relationship between the thermal disturbance drive signal d and the thermal disturbance received by the temperature control target S is known data derived by an experiment or the like. In addition, the thermal disturbance drive signal d has been created as a specification of the process. The thermal disturbance drive future signal df is a thermal disturbance drive signal d scheduled to be input at a future time later than a time at which the signal is actually input to the plasma processing apparatus. That is, in a case where the time at which the thermal disturbance drive signal d is actually input to the plasma processing apparatus is denoted as t0, the thermal disturbance drive future signal df is a thermal disturbance drive signal d scheduled to be input at a future time t1 later than the time t0 by a certain number of steps. The thermal disturbance drive future signal df is derived from the specifications of the process.

The feedforward control unit 82 can calculate a manipulated variable MV2c for canceling the thermal disturbance scheduled to be received by the temperature control target S at the future time t1 on the basis of the thermal disturbance drive future signal df scheduled to be input to the temperature control target S, the dynamic characteristic model of the temperature control target S, and the dynamic characteristic model of the second temperature control device 4.

The second controller 8 calculates a manipulated variable MV2 by adding up the manipulated variable MV2a calculated by the feedback control unit 81 and the manipulated variable MV2c calculated by the feedforward control unit 82 and controls the second temperature control device 4 on the basis of the manipulated variable MV2.

The first controller 7 feedback-controls the first temperature control device 3 on the basis of a detection value of the first temperature sensor 61 so that the temperature of the fluid F flowing out of the first temperature control device 3 becomes the first target temperature SV1. That is, the first controller 7 feeds back the temperature T1 which is the detection value of the first temperature sensor 61, calculates a manipulated variable MV1 from a deviation from the first target temperature SV1, and controls the first temperature control device 3 on the basis of the manipulated variable MV1.

The first target temperature SV1 is determined on the basis on the second target temperature SV2. As in the second embodiment described above, the first target temperature SV1 is determined on the basis of the second target temperature SV2, a specified value α related to the temperature control capability of the second temperature control device 4, and the detection value of the second temperature sensor 62C. Also in the present embodiment, [SV1=SV2−α+(SV2−T2c)].

As described above, according to the present embodiment, the second controller 8 includes the feedback control unit 81 and the preview feedforward control unit 83. The preview feedforward control unit 83 can control the second temperature control device 4 in consideration of the thermal disturbance scheduled to be received by the temperature control target S. Therefore, the temperature control system 1 can control the temperature of the fluid F with high accuracy using the first temperature control device 3 and the second temperature control device 4.

Note that, in the first to fourth embodiments described above, it is based on the premise that the specified value α is a variable that varies on the basis of the second target temperature SV2. The specified value α may be a constant.

Fifth Embodiment

A fifth embodiment will be described. In the following description, the same or equivalent components as those of the above embodiment are denoted by the same symbols, and description thereof is simplified or omitted.

Figure 9:
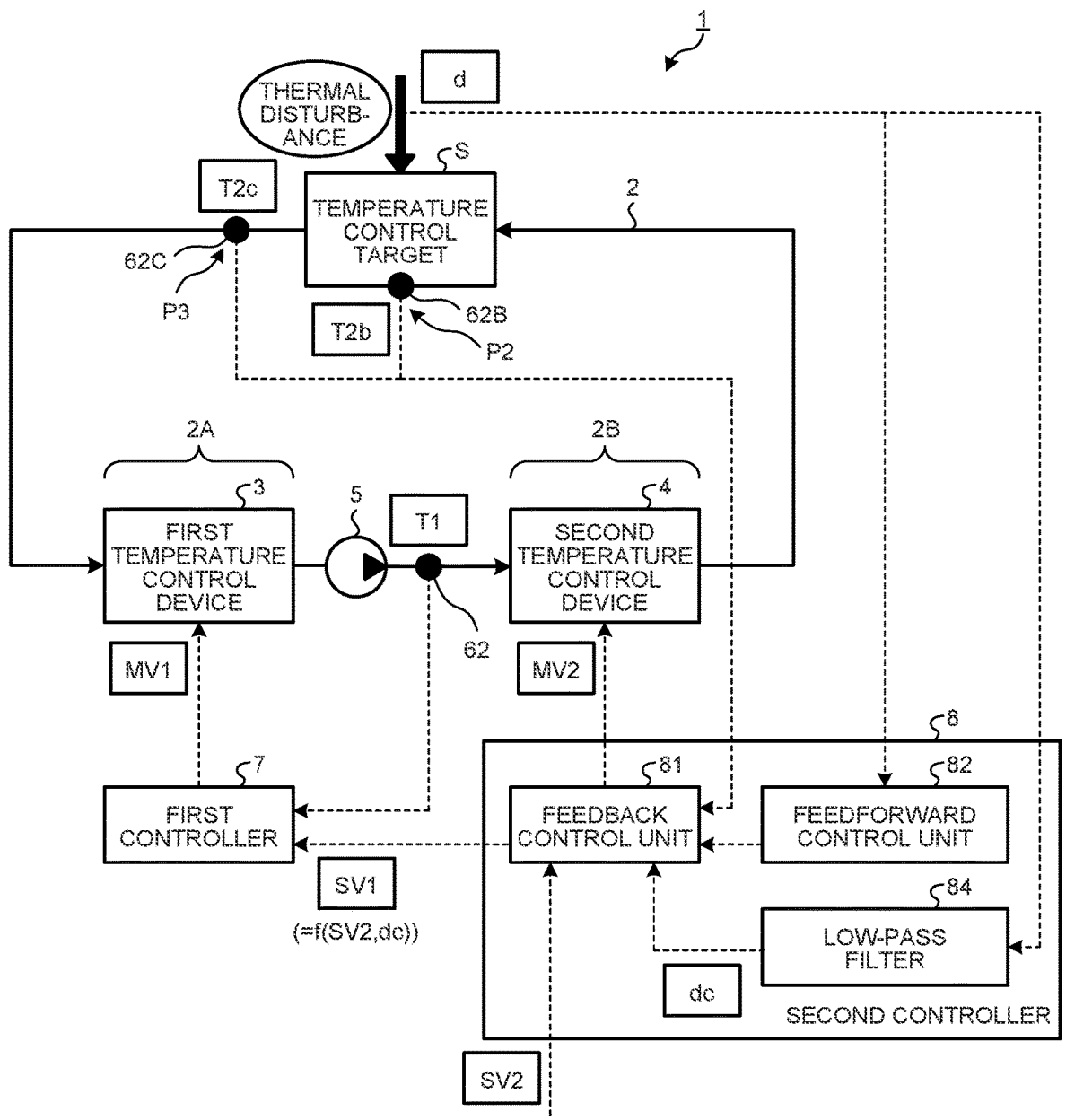
FIG. 9 is a block diagram illustrating a temperature control system according to a fifth embodiment.

FIG. 9 is a block diagram illustrating a temperature control system 1 according to the present embodiment. Also in the present embodiment, a control method for bringing the temperature of the fluid F at the third predetermined position P3 set between the outlet of the temperature control target S and the inlet of the first temperature control device 3 to the second target temperature SV2 will be described. Note that a control method for bringing the temperature of the temperature control target S at the second predetermined position P2 to the second target temperature SV2 is similar.

As illustrated in FIG. 9, the temperature control system 1 includes the circulation flow path 2 including the temperature control target S, the first temperature control device 3, the second temperature control device 4, the first temperature sensor 61, the second temperature sensor 62C, the first controller 7, and a second controller 8.

As in the third embodiment described above, the second controller 8 includes: a feedback control unit 81 that outputs a control command to the second temperature control device 4 on the basis of a detection value of the second temperature sensor 62C; and a feedforward control unit 82 that outputs a control command to the second temperature control device 4 on the basis of a thermal disturbance drive signal d input to the temperature control target S, a dynamic characteristic model of the temperature control target S, and a dynamic characteristic model of the second temperature control device 4. The second controller 8 also includes a low-pass filter 84.

The feedback control unit 81 feedback-controls the second temperature control device 4 on the basis of a detection value of the second temperature sensor 62C so that the temperature of the fluid F flowing out of the second temperature control device 4 becomes the second target temperature SV2. That is, the feedback control unit 81 feeds back the temperature T2c, which is the detection value of the second temperature sensor 62C, and calculates a manipulated variable MV2a from the deviation from the second target temperature SV2.

The feedforward control unit 82 feedforward-controls the second temperature control device 4 so that the temperature of the fluid F flowing out of the temperature control target S becomes the second target temperature SV2 on the basis of the thermal disturbance drive signal d input to the temperature control target S, the dynamic characteristic model of the temperature control target S, and the dynamic characteristic model of the second temperature control device 4.

The second controller 8 calculates a manipulated variable MV2 by adding up the manipulated variable MV2a calculated by the feedback control unit 81 and the manipulated variable MV2b calculated by the feedforward control unit 82 and controls the second temperature control device 4 on the basis of the manipulated variable MV2.

The first controller 7 feedback-controls the first temperature control device 3 on the basis of a detection value of the first temperature sensor 61 so that the temperature of the fluid F flowing out of the first temperature control device 3 becomes the first target temperature SV1. That is, the first controller 7 feeds back the temperature T1 which is the detection value of the first temperature sensor 61, calculates a manipulated variable MV1 from a deviation from the first target temperature SV1, and controls the first temperature control device 3 on the basis of the manipulated variable MV1.

The low-pass filter 84 generates a signal dc obtained by cutting off high-frequency components of the thermal disturbance drive signal d used for determination of the first target temperature SV1. Even when the thermal disturbance drive signal d rapidly changes, the low-pass filter 84 suppresses a rapid change in the first target temperature SV1.

The first target temperature SV1 is determined on the basis on the second target temperature SV2. In the present embodiment, the first target temperature SV1 is determined on the basis of the second target temperature SV2 and the thermal disturbance drive signal d. In the present embodiment, [SV1=SV2−dc×β]. Note that β is a conversion coefficient.

As described above, according to the present embodiment, the first target temperature SV1 is determined on the basis of the second target temperature SV2 and the thermal disturbance drive signal d. Depending on the magnitude of the thermal disturbance, the temperature control capability of the second temperature control device 4 may be insufficient. The thermal disturbance drive signal d is used for determination of the first target temperature SV1 in order to compensate for the shortage of the temperature control capability of the second temperature control device 4 by the first temperature control device 3. In a case where the thermal disturbance drive signal d increases, the first target temperature SV1 decreases. As a result, the first temperature control device 3 can compensate for the shortage of the temperature control capability of the second temperature control device 4.

Note that the second controller 8 may include the preview feedforward control unit 83 as described in the fourth embodiment.

OTHER EMBODIMENTS

In the above-described embodiments, it is based on the premise that the first portion 2A to which the first temperature control device 3 supplies the fluid F is the tank 9 disposed in the circulation flow path 2. The first portion 2A to which the first temperature control device 3 supplies the fluid F may be a part of the circulation flow path 2.

The invention claimed is:

1. A temperature control system, comprising:
a circulation flow path that includes a temperature control target, the circulation flow path through which fluid flows;
a first temperature control device that adjusts a temperature of the fluid in a first portion of the circulation flow path by supplying, to the first portion, at least one of the fluid having a first temperature or the fluid having a second temperature higher than the first temperature;
a second temperature control device that adjusts the temperature of the fluid supplied to the temperature control target at a second portion of the circulation flow path between the first portion and the temperature control target;
a first temperature sensor that detects the temperature of the fluid supplied from the first portion to the second portion;
a second temperature sensor that detects the temperature of the fluid or the temperature control target at a predetermined position in the circulation flow path between an outlet of the second portion and an inlet of the first portion;
a first controller that controls the first temperature control device on a basis of a detection value of the first temperature sensor such that the temperature of the fluid supplied from the first portion to the second portion becomes a first target temperature; and
a second controller that controls the second temperature control device on a basis of a detection value of the second temperature sensor such that the temperature of the fluid becomes a second target temperature at the predetermined position,
wherein the first target temperature is determined on a basis of the second target temperature,
wherein the predetermined position is set between the second portion and the temperature control target, and
wherein the first target temperature is determined on a basis of the second target temperature and a specified value related to temperature control capability of the second temperature control device.

2. The temperature control system according to claim 1, wherein the specified value is set to a larger value as the second target temperature is lower and set to a smaller value as the second target temperature is higher.

3. The temperature control system according to claim 1, wherein a temperature adjustable range of the first temperature control device is wider than a temperature adjustable range of the second temperature control device, and
a response speed of the second temperature control device is higher than a response speed of the first temperature control device.

4. The temperature control system according to claim 1, wherein the first temperature control device comprises:
a low-temperature control unit that stores the fluid having the first temperature;
a high-temperature control unit that stores the fluid having the second temperature;
a low-temperature flow path through which the fluid supplied from the low-temperature control unit to the first portion flows;
a high-temperature flow path through which the fluid supplied from the high-temperature control unit to the first portion flows; and
a valve system that adjusts a flow rate of the fluid flowing through the low-temperature flow path and a flow rate of the fluid flowing through the high-temperature flow path,
wherein the first controller controls the valve system.

5. The temperature control system according to claim 1, wherein the first portion includes a tank disposed in the circulation flow path.

6. The temperature control system according to claim 1, wherein the second temperature control device includes a thermoelectric module, and
the second controller controls the thermoelectric module.

7. A temperature control system, comprising:
a circulation flow path that includes a temperature control target, the circulation flow path through which fluid flows;
a first temperature control device that adjusts a temperature of the fluid in a first portion of the circulation flow path by supplying, to the first portion, at least one of the fluid having a first temperature or the fluid having a second temperature higher than the first temperature;
a second temperature control device that adjusts the temperature of the fluid supplied to the temperature control target at a second portion of the circulation flow path between the first portion and the temperature control target;
a first temperature sensor that detects the temperature of the fluid supplied from the first portion to the second portion;
a second temperature sensor that detects the temperature of the fluid or the temperature control target at a predetermined position in the circulation flow path between an outlet of the second portion and an inlet of the first portion;
a first controller that controls the first temperature control device on a basis of a detection value of the first temperature sensor such that the temperature of the fluid supplied from the first portion to the second portion becomes a first target temperature; and
a second controller that controls the second temperature control device on a basis of a detection value of the second temperature sensor such that the temperature of the fluid becomes a second target temperature at the predetermined position,
wherein the first target temperature is determined on a basis of the second target temperature,
wherein the predetermined position is set between an inlet of the temperature control target and an inlet of the first temperature control device, and
wherein the first target temperature is determined on a basis of the second target temperature, a specified value related to a temperature control capability of the second temperature control device, and the detection value of the second temperature sensor.

8. The temperature control system according to claim 7, wherein the specified value is set to a larger value as the second target temperature is lower and set to a smaller value as the second target temperature is higher.

9. A temperature control system, comprising:
a circulation flow path that includes a temperature control target, the circulation flow path through which fluid flows;
a first temperature control device that adjusts a temperature of the fluid in a first portion of the circulation flow path by supplying, to the first portion, at least one of the fluid having a first temperature or the fluid having a second temperature higher than the first temperature;
a second temperature control device that adjusts the temperature of the fluid supplied to the temperature control target at a second portion of the circulation flow path between the first portion and the temperature control target;
a first temperature sensor that detects the temperature of the fluid supplied from the first portion to the second portion;
a second temperature sensor that detects the temperature of the fluid or the temperature control target at a predetermined position in the circulation flow path between an outlet of the second portion and an inlet of the first portion;
a first controller that controls the first temperature control device on a basis of a detection value of the first temperature sensor such that the temperature of the fluid supplied from the first portion to the second portion becomes a first target temperature; and
a second controller that controls the second temperature control device on a basis of a detection value of the second temperature sensor such that the temperature of the fluid becomes a second target temperature at the predetermined position,
wherein the first target temperature is determined on a basis of the second target temperature,
wherein the predetermined position is set between an inlet of the temperature control target and an inlet of the first temperature control device, and
wherein the second controller comprises:
a feedback control unit that outputs a control command to the second temperature control device on a basis of the detection value of the second temperature sensor; and
a feedforward control unit that outputs a control command to the second temperature control device on a basis of a thermal disturbance drive signal input to the temperature control target, a dynamic characteristic model of the temperature control target, and a dynamic characteristic model of the second temperature control device.

10. The temperature control system according to claim 9, wherein the first target temperature is determined on a basis of the second target temperature, a specified value related to a temperature control capability of the second temperature control device, and the detection value of the second temperature sensor.

11. The temperature control system according to claim 10, wherein the specified value is set to a larger value as the second target temperature is lower and set to a smaller value as the second target temperature is higher.

12. The temperature control system according to claim 9, wherein the first target temperature is determined on a basis of the second target temperature and the thermal disturbance drive signal.

13. A temperature control system, comprising:
a circulation flow path that includes a temperature control target, the circulation flow path through which fluid flows;
a first temperature control device that adjusts a temperature of the fluid in a first portion of the circulation flow path by supplying, to the first portion, at least one of the fluid having a first temperature or the fluid having a second temperature higher than the first temperature;
a second temperature control device that adjusts the temperature of the fluid supplied to the temperature control target at a second portion of the circulation flow path between the first portion and the temperature control target;
a first temperature sensor that detects the temperature of the fluid supplied from the first portion to the second portion;
a second temperature sensor that detects the temperature of the fluid or the temperature control target at a predetermined position in the circulation flow path between an outlet of the second portion and an inlet of the first portion;
a first controller that controls the first temperature control device on a basis of a detection value of the first temperature sensor such that the temperature of the fluid supplied from the first portion to the second portion becomes a first target temperature; and
a second controller that controls the second temperature control device on a basis of a detection value of the second temperature sensor such that the temperature of the fluid becomes a second target temperature at the predetermined position, wherein the first target temperature is determined on a basis of the second target temperature, wherein the predetermined position is set between an inlet of the temperature control target and an inlet of the first temperature control device, and wherein the second controller comprises:

a feedback control unit that outputs a control command to the second temperature control device on a basis of the detection value of the second temperature sensor; and a preview feedforward control unit that outputs a control command to the second temperature control device on a basis of a thermal disturbance drive future signal scheduled to be input to the temperature control target, a dynamic characteristic model of the temperature control target, and a dynamic characteristic model of the second temperature control device.

14. The temperature control system according to claim 13, wherein the first target temperature is determined on a basis of the second target temperature, a specified value related to a temperature control capability of the second temperature control device, and the detection value of the second temperature sensor.

15. The temperature control system according to claim 14, wherein the specified value is set to a larger value as the second target temperature is lower and set to a smaller value as the second target temperature is higher.

* * * * *